United States Patent
Colgan et al.

(10) Patent No.: US 10,892,170 B2
(45) Date of Patent: *Jan. 12, 2021

(54) FABRICATING AN INTEGRATED CIRCUIT CHIP MODULE WITH STIFFENING FRAME AND ORTHOGONAL HEAT SPREADER

(71) Applicant: International Business Machines Corporation, Armonk, NY (US)

(72) Inventors: Evan G. Colgan, Montvale, NJ (US); Yi Pan, The Woodlands, TX (US); Hilton T. Toy, Hopewell Junction, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

This patent is subject to a terminal disclaimer.

(21) Appl. No.: 15/996,030

(22) Filed: Jun. 1, 2018

(65) Prior Publication Data

US 2018/0277396 A1    Sep. 27, 2018

Related U.S. Application Data

(63) Continuation of application No. 14/732,119, filed on Jun. 5, 2015, now Pat. No. 10,090,173.

(51) Int. Cl.
*H01L 21/52* (2006.01)
*H05K 3/30* (2006.01)
(Continued)

(52) U.S. Cl.
CPC .............. *H01L 21/52* (2013.01); *H01L 23/04* (2013.01); *H01L 23/16* (2013.01); *H01L 23/367* (2013.01);
(Continued)

(58) Field of Classification Search
CPC ......... H01L 21/52; H01L 23/04; H01L 23/16; H01L 23/3675; H01L 23/467;
(Continued)

(56) References Cited

U.S. PATENT DOCUMENTS 5,395,679 A    3/1995 Myers
5,406,807 A    4/1995 Ashiwake
(Continued)

FOREIGN PATENT DOCUMENTS

| JP | 2006140295 A | * | 6/2006 | ............. H01L 24/81 |
|----|--------------|---|--------|-------------------------|
| JP | 2011159701 A |   | 8/2011 |                         |
| JP | 2011238643 A |   | 11/2011|                         |

OTHER PUBLICATIONS

List of IBM Patents or Patent Applications Treated As Related, dated herewith.
(Continued)

*Primary Examiner* — A. Dexter Tugbang
(74) *Attorney, Agent, or Firm* — ZIP Group PLLC

(57) ABSTRACT

An integrated circuit (IC) chip module includes a carrier, a stiffening frame, an IC chip, a first directional heat spreader, and a second directional heat spreader. Presented herein is a fabrication method that includes attaching the stiffening frame to the carrier. The stiffening frame includes a central opening, a base portion, a first pair of opposing sidewalls, and a second pair of opposing sidewalls. The method includes electronically coupling the semiconductor chip to the carrier concentrically arranged within the central opening. The method includes thermally contacting the first directional heat spreader to the semiconductor chip. The first directional heat spreader transfers heat from the semiconductor chip towards the first pair of opposing sidewalls. The method includes thermally contacting the second directional heat spreader to the first directional heat spreader. The
(Continued)

second directional heat spreader transfers heat from the first directional heat spreader towards the second pair of opposing sidewalls.

12 Claims, 9 Drawing Sheets

(51) Int. Cl.
| | |
|---|---|
| *H01L 23/367* | (2006.01) |
| *H01L 23/04* | (2006.01) |
| *H01L 23/467* | (2006.01) |
| *H01L 23/473* | (2006.01) |
| *H01L 23/498* | (2006.01) |
| *H01L 23/16* | (2006.01) |
| *H01L 23/40* | (2006.01) |
| *H01L 23/427* | (2006.01) |
| *H01L 23/00* | (2006.01) |
| *H05K 3/34* | (2006.01) |

(52) U.S. Cl.
CPC ...... *H01L 23/3675* (2013.01); *H01L 23/4006* (2013.01); *H01L 23/427* (2013.01); *H01L 23/467* (2013.01); *H01L 23/473* (2013.01); *H01L 23/49838* (2013.01); *H05K 3/303* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 24/83* (2013.01); *H01L 24/92* (2013.01); *H01L 2023/4037* (2013.01); *H01L 2224/131* (2013.01); *H01L 2224/16227* (2013.01); *H01L 2224/32225* (2013.01); *H01L 2224/32245* (2013.01); *H01L 2224/45099* (2013.01); *H01L 2224/48227* (2013.01); *H01L 2224/73204* (2013.01); *H01L 2224/73253* (2013.01); *H01L 2224/81815* (2013.01); *H01L 2224/83191* (2013.01); *H01L 2224/92125* (2013.01); *H01L 2224/92225* (2013.01); *H01L 2924/00014* (2013.01); *H01L 2924/014* (2013.01); *H01L 2924/1432* (2013.01); *H01L 2924/1433* (2013.01); *H01L 2924/1579* (2013.01); *H01L 2924/15311* (2013.01); *H01L 2924/15312* (2013.01); *H01L 2924/15313* (2013.01); *H01L 2924/15787* (2013.01); *H01L 2924/16793* (2013.01); *H01L 2924/171* (2013.01); *H01L 2924/176* (2013.01); *H01L 2924/1715* (2013.01); *H01L 2924/19041* (2013.01); *H01L 2924/19043* (2013.01); *H01L 2924/19105* (2013.01); *H05K 3/3436* (2013.01); *H05K 2201/10674* (2013.01); *H05K 2201/2018* (2013.01)

(58) Field of Classification Search
CPC . H01L 23/473; H01L 23/49838; H01L 24/13; H01L 24/16; H01L 24/32; H01L 24/48; H01L 24/73; H01L 24/81; H01L 24/83; H01L 24/92; H01L 2224/131; H01L 2224/16227; H01L 2224/32225; H01L 2224/32245; H01L 2224/48227; H01L 2224/45099; H01L 2224/73204; H01L 2224/73253; H01L 2224/81815; H01L 2224/83191; H01L 2224/92125; H01L 2224/92225; H01L 2924/00014; H01L 2924/014; H01L 2924/1432; H01L 2924/1433; H01L 2924/15311; H01L 2924/15312; H01L 2924/15313; H01L 2924/15787; H01L 2924/1579; H01L 2924/16793; H01L 2924/1715; H01L 2924/171; H01L 2924/176; H01L 2924/19041; H01L 2924/19043; H01L 2924/19105; H01L 23/367; H01L 23/427; H05K 3/303; H05K 3/3436; H05K 2201/10674; H05K 2201/2018
See application file for complete search history.

(56) References Cited

U.S. PATENT DOCUMENTS

| | | |
|---|---|---|
| 5,458,716 A | 10/1995 | Alfaro et al. |
| 5,471,027 A | 11/1995 | Call |
| 5,475,565 A | 12/1995 | Bhattacharyya et al. |
| 5,625,222 A | 4/1997 | Yoneda |
| 5,808,236 A | 9/1998 | Brezina |
| 5,821,161 A | 10/1998 | Covell, II et al. |
| 5,907,189 A * | 5/1999 | Mertol ............... H01L 24/48 251/104 |
| 5,956,576 A | 9/1999 | Toy |
| 5,964,396 A | 10/1999 | Brofman |
| 6,055,159 A | 4/2000 | Sun |
| 6,111,314 A | 8/2000 | Edwards |
| 6,160,709 A | 12/2000 | Li |
| 6,191,480 B1 | 2/2001 | Kastberg |
| 6,198,630 B1 | 3/2001 | Cromwell |
| 6,407,922 B1 | 6/2002 | Eckblad et al. |
| 6,413,353 B2 | 7/2002 | Pompeo |
| 6,466,443 B1 | 10/2002 | Chen |
| 6,542,369 B1 | 4/2003 | Wu |
| 6,570,250 B1 | 5/2003 | Pommer |
| 6,618,251 B2 | 9/2003 | Ishimine |
| 6,657,864 B1 | 12/2003 | Dyckman |
| 6,728,107 B2 | 4/2004 | Tseng |
| 6,731,506 B1 | 5/2004 | Dong |
| 6,791,847 B2 | 9/2004 | Ma |
| 7,031,162 B2 | 4/2006 | Arvelo |
| 7,228,894 B2 | 6/2007 | Moore et al. |
| 7,394,659 B2 | 7/2008 | Colgan |
| 7,443,026 B2 | 10/2008 | Goldmann |
| 7,518,235 B2 | 4/2009 | Coico |
| 8,059,408 B2 | 11/2011 | Lemak et al. |
| 8,115,303 B2 | 2/2012 | Bezama |
| 8,169,789 B1 | 5/2012 | Tong |
| 8,542,488 B2 | 9/2013 | Peterson et al. |
| 8,693,200 B2 | 4/2014 | Colgan |
| 9,089,052 B2 | 7/2015 | Li |
| 9,583,408 B1 | 2/2017 | Interrante |
| 2002/0109226 A1 | 8/2002 | Khan |
| 2003/0067746 A1 | 4/2003 | Ishimine |
| 2003/0197256 A1 | 10/2003 | Pommer |
| 2006/0011336 A1 | 1/2006 | Frul |
| 2007/0053168 A1 | 3/2007 | Sayir et al. |
| 2008/0174968 A1 | 7/2008 | Feng |
| 2009/0288806 A1 | 11/2009 | Lin |
| 2011/0134106 A1 | 6/2011 | Reis et al. |
| 2011/0293504 A1 | 12/2011 | Mohamed et al. |
| 2012/0299173 A1 | 11/2012 | Mohammed |
| 2014/0151871 A1 | 6/2014 | Refai-Ahmed |
| 2014/0284040 A1 | 9/2014 | Colgan et al. |

OTHER PUBLICATIONS

Quesnel, "Thermal Conductivity: What is it and Why You Should Care," web address: https://www.digikey.com/en/articles/techzone/2015/jul/thermal-conductivity-what-is-it-and-why-you-should-care, dated Oct. 2011.

Dillow, "New Plastic Conducts Heat Better Than Metals, But Only in One Direction," web address: https://www.popsci.com/science/article/2010-03/new-polymer-conducts-better-metals-only-one-direction, dated Mar. 9, 2010.

* cited by examiner

FABRICATING AN INTEGRATED CIRCUIT CHIP MODULE WITH STIFFENING FRAME AND ORTHOGONAL HEAT SPREADER

FIELD OF THE EMBODIMENTS

Embodiments of the present invention generally relate to electronic devices and more specifically to an electronic device module that includes a carrier, integrated circuit (IC) chip, stiffening frame, and/or orthogonal heat spreader.

DESCRIPTION OF THE RELATED ART

Though the size constrains of electronic devices are generally decreasing, the computing power of those devices are generally increasing. As such, electronic device will generally require high power consumption devices which requires the removal of an increased amount of heat. Another approach may be to package more computing devices in a smaller area which would also require the removal of an increased amount of heat. Typically, an IC chip module is an electronic package with at least one IC chip, semiconductor die, and the like, packaged onto a carrier or substrate.

SUMMARY

In an embodiment of the present invention, a method is presented. The method includes attaching a stiffening frame to a carrier. The stiffening frame includes a central opening to accept a semiconductor chip, a base portion, a first pair of opposing sidewalls, and a second pair of opposing sidewalls. The method includes electronically coupling the semiconductor chip to the carrier concentrically arranged within the central opening. The method includes thermally contacting a first directional heat spreader to the semiconductor chip. The first directional heat spreader is arranged to transfer heat from the semiconductor chip in a first opposing bivector direction towards the first pair of opposing sidewalls. The method also includes thermally contacting a second directional heat spreader to the first directional heat spreader. The second directional heat spreader arranged to transfer heat from the first directional heat spreader in a second opposing bivector direction towards the second pair of opposing sidewalls.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

An embodiment of the present invention is related to an IC chip module that includes a carrier, a stiffening frame, an IC chip, and a first directional heat spreader. A second directional heat spreader may further be arranged orthogonal to the first directional heat spreader. The carrier has a top surface and a bottom surface configured to be electrically connected to a motherboard. The stiffening frame includes an opening that accepts the IC chip and may be attached to the top surface of the carrier. The IC chip is concentrically arranged within the opening of the stiffening frame. The first directional heat spreader is attached to the stiffening frame and to the IC chip and generally removes heat in a first opposing bivector direction. When included in the IC chip module, the second directional heat spreader is attached to the stiffening frame and to the first directional heat spreader and generally removes heat in a second opposing bivector direction orthogonal to the first opposing bivector direction.

Figure 1:
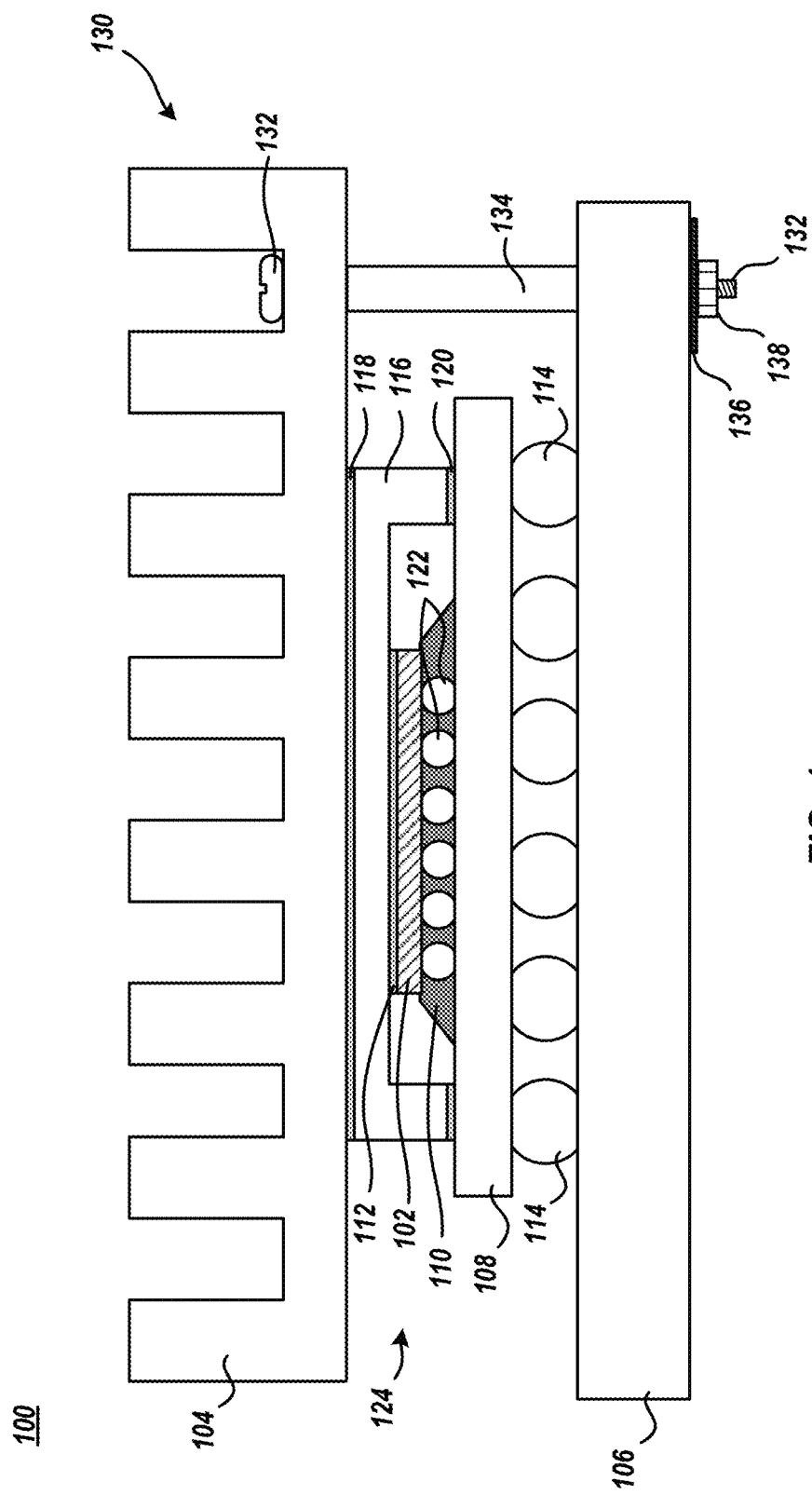
FIG. 1 depicts a prior art single chip module.

FIG. 1 depicts a prior art electronic device 100 utilizing single chip module 124. Electronic device 100 may be for example a computer, server, mobile device, tablet, and the like. Single chip module 124 includes chip 102, carrier 108, interconnects 122, underfill 110, thermal interface material 112, lid 116, and adhesive 120. Chip 102 may be an integrated circuit, semiconductor die, processor, microchip, and the like. Carrier 108 may be an organic carrier or a ceramic carrier and provides mechanical support for Chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Single chip module 124 may be connected to a motherboard 106 via interconnects 114. Motherboard 106 may be the main printed circuit board of electronic device 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, and the like. Interconnects 114 may be larger and thus more robust than interconnects 122. When single chip module 124 is seated upon motherboard 106 a second reflow process may be performed to join interconnects 114 to electrical contacts of both carrier 108 and motherboard 106. Alternately, a mechanical pressurized interconnect may be established.

To assist in the removal of heat from chip 102 a heat sink 104 may be thermally joined to single chip module 124 via thermal interface material 118. Heat sink 104 may be a passive heat exchanger that cools chip 102 by dissipating heat into the surrounding air. As such, during operation of electronic device 100, a thermal path exists from chip 102 to heat sink 104 through thermal interface material 112, lid 116, and thermal interface material 118, and the like. Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon single chip module 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon single chip module 124.

Figure 2:
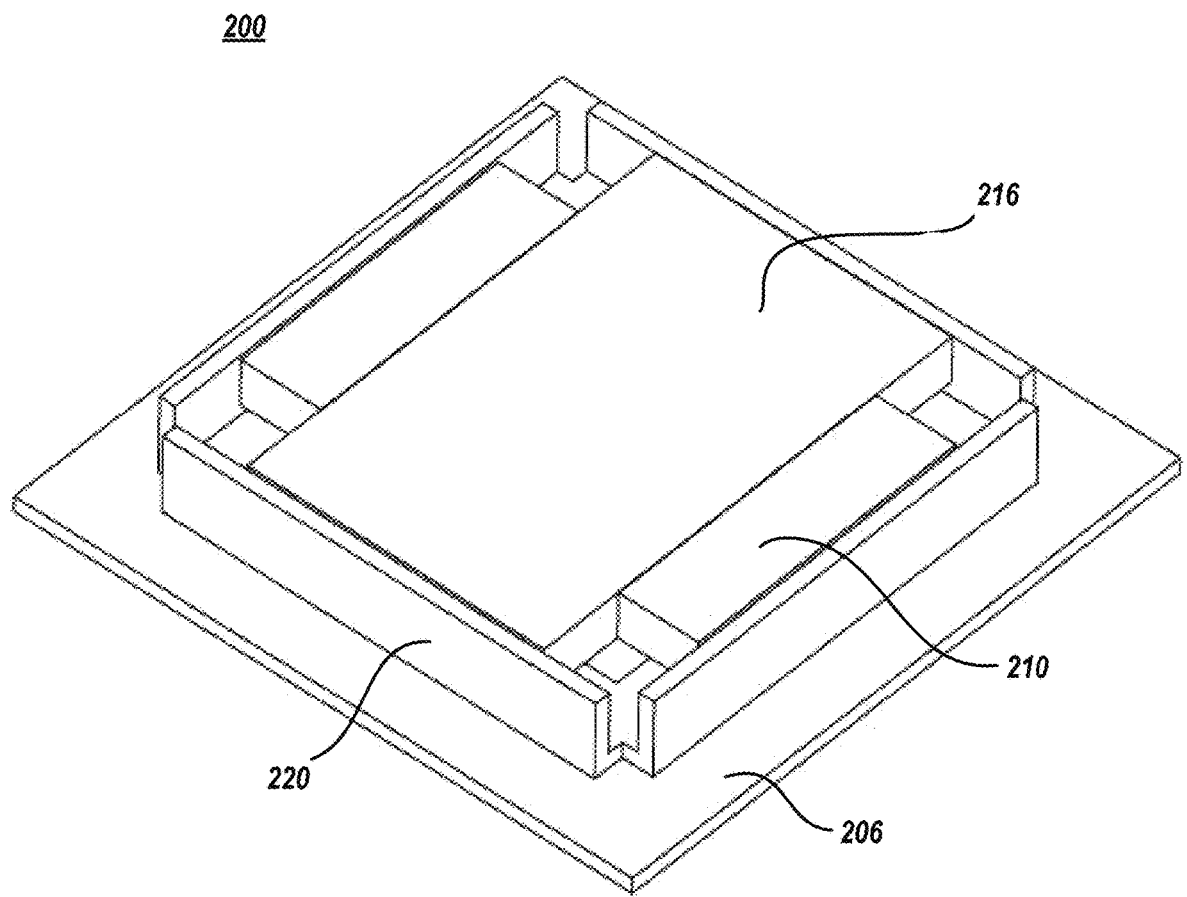
FIG. 2 depicts an IC chip module, according to one or more embodiments of the present invention.
Figure 3:
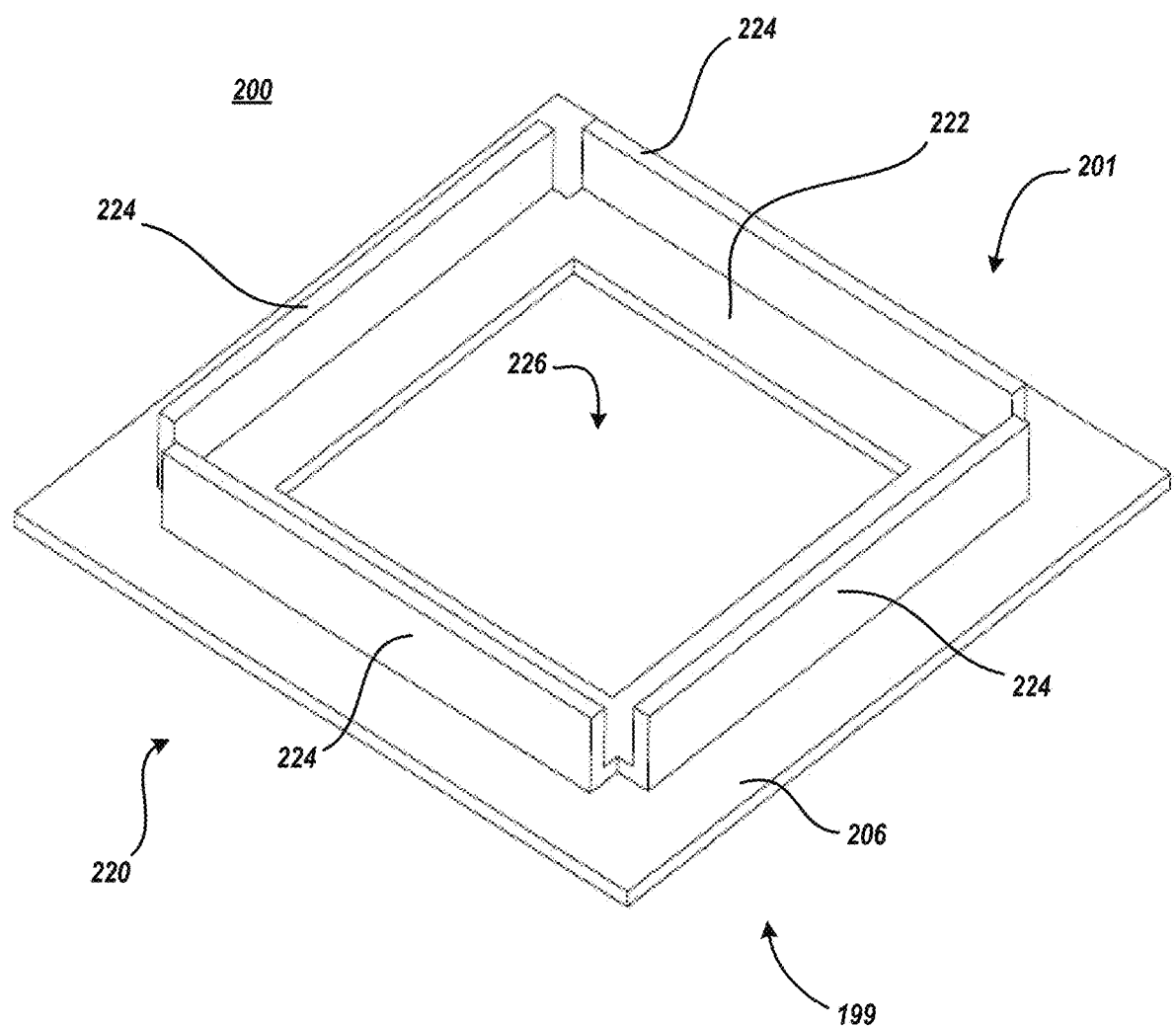
FIG. 3-FIG. 7 depict portions of an IC chip module, according to one or more embodiments of the present invention.
Figure 4:
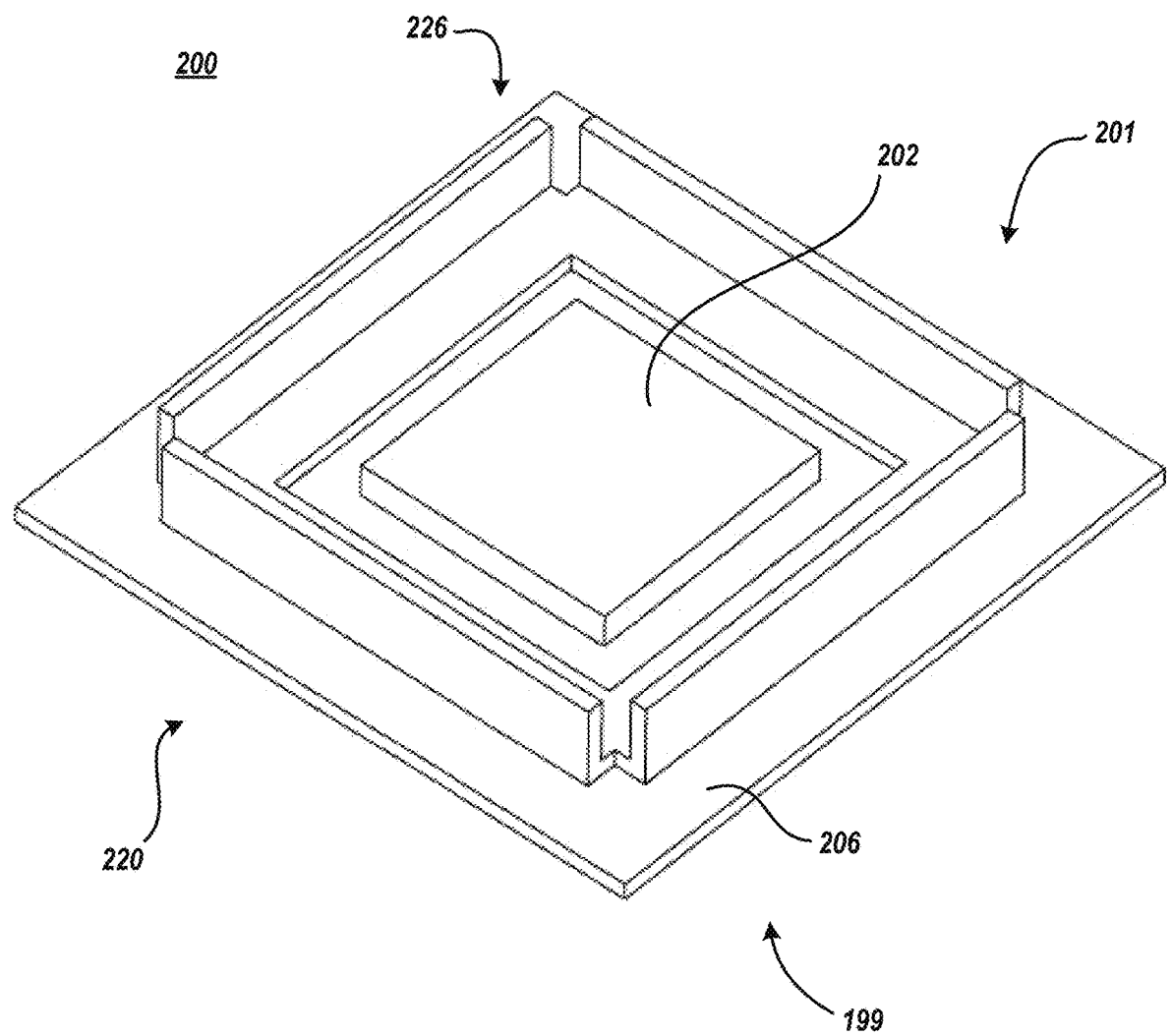
Figure 5:
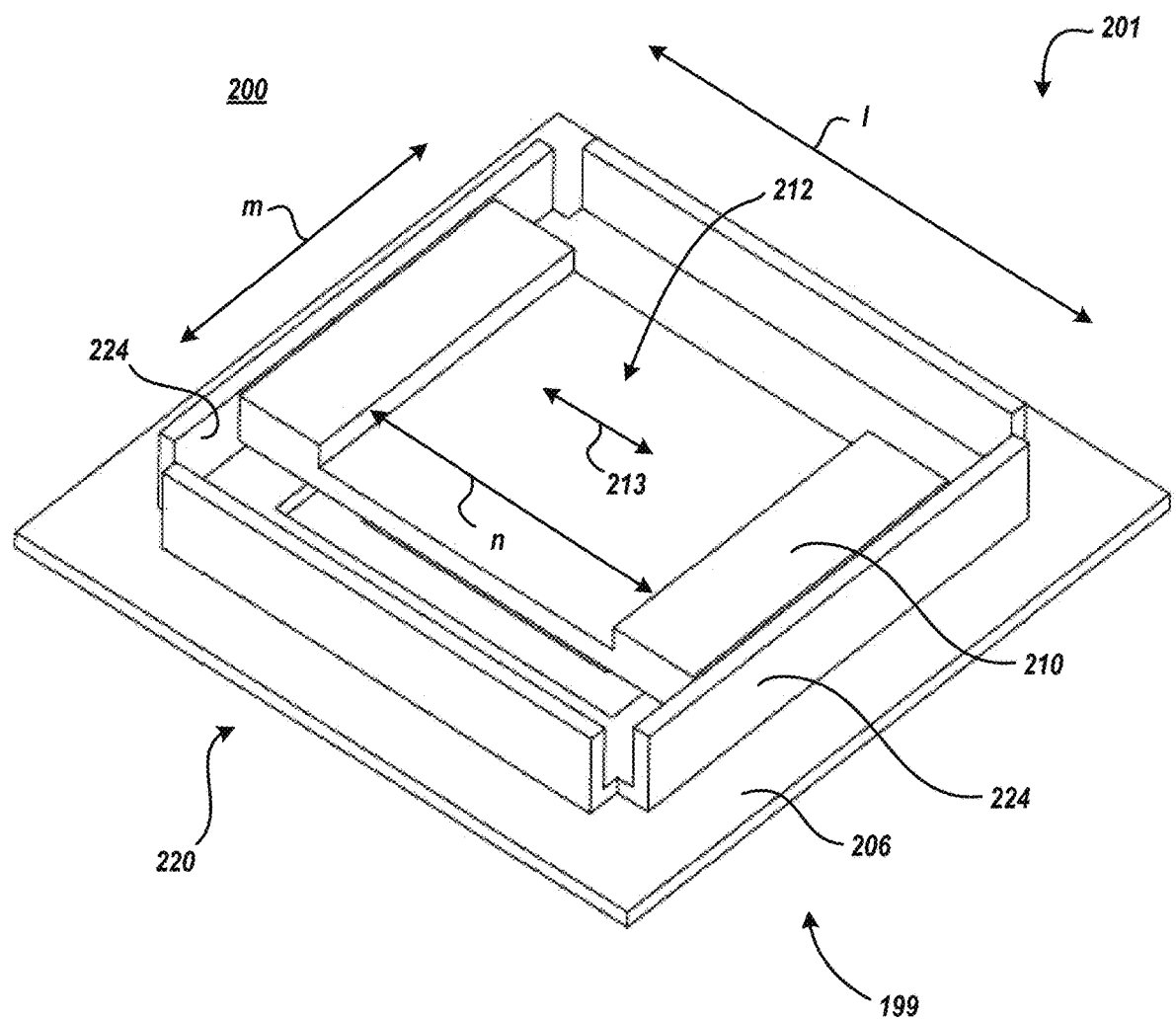
Figure 6:
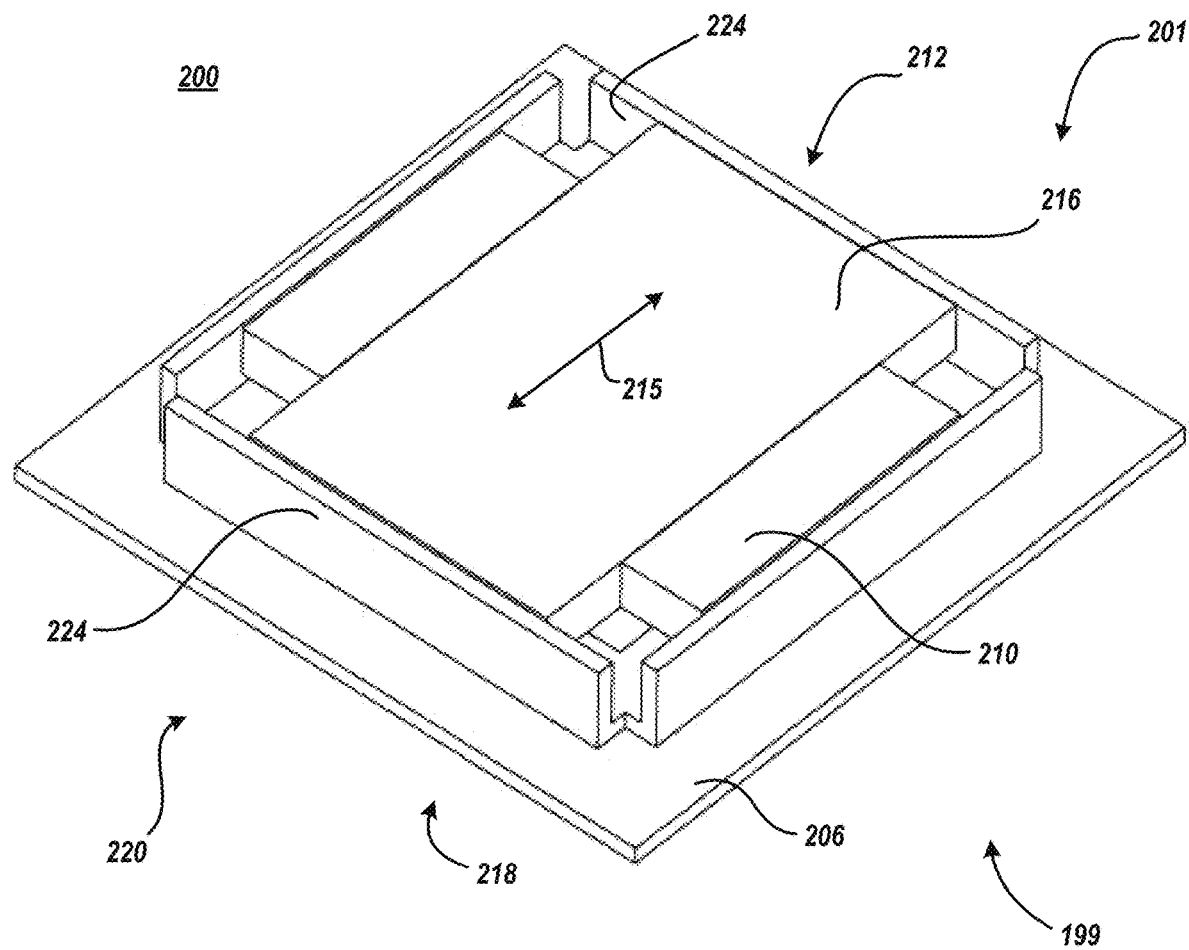
Figure 7:
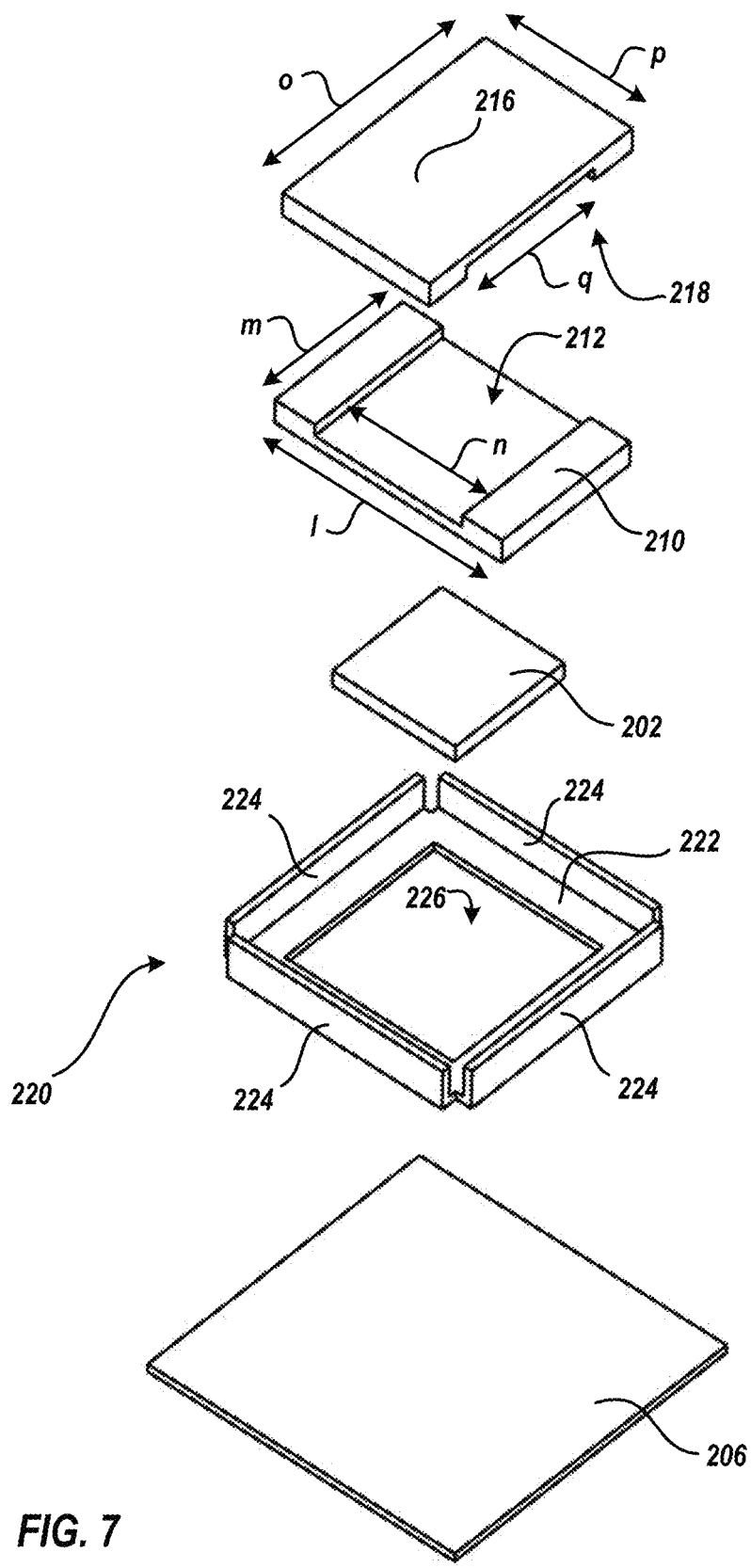

Referring to FIG. 2.-FIG. 7 simultaneously, which depict an exemplary IC chip module 200. IC chip module 200 may include a carrier 206, stiffening frame 220, an IC chip 202, a first directional heat spreader 210, and a second directional heat spreader 216.

Carrier 206 provides a base on which one or more IC chip(s) 202 are mounted and electrically connected thereto via a plurality of interconnects (e.g. solder, pillars, wire bonds, C4, and the like). Carrier 206 may be composed of ceramic or organic materials. If organic, carrier 206 may include multiple layers of metallization and dielectric materials. Depending upon the configuration of layers, carrier 206 may be a coreless, thin core, or standard core design. The dielectric materials may be, for example, epoxy resin with or without fiberglass fill. In various embodiments, carrier 206 may interconnect with other devices such as a socket (pin grid array, land grid array, ball grid array, and the like). In various embodiments, carrier 206 may include other devices besides IC chip 202, for example, surface mount devices (e.g. capacitors, resistors, and the like).

IC chip 202 may be for example a die, microchip, microprocessor, graphic processor, combined processor and graphics processor, application specific integrated circuit (ASIC), system on a chip (SOC), three dimensional integrated circuit, system on insulator (SOI), and the like.

Carrier 206 includes stiffening frame 220 that is attached to carrier 206 using a high strength adhesive, such as an epoxy, and the like. Stiffening frame 220 improves carrier 206 flatness, and in particular improves the flatness of an underside 199 of carrier 206. Stiffening frame 220 may also particularly improve the flatness of a topside 201 of carrier 206. The flatness of carrier 206 at least partially allows for more efficient assembly or installation of the IC chip module 200 to the next level of assembly (e.g. motherboard, heat sink, and the like). Stiffening frame 220 provides mechanical support for carrier 206 and may be particular advantageous in those applications where carrier 206 is relatively thin (e.g. coreless, thin core, and the like). Stiffening frame 220 is made utilizing materials with a desirable mechanical strength (e.g. copper, nickel, stainless steel, titanium, aluminum, molded plastics, ceramics, composites or combinations of each, and the like). Stiffening frame 220 may be made utilizing materials with a desirable CTE (e.g. similar CTE as carrier 206, and the like). Stiffening frame 220 may be made by forging, plating, stamping, molding, casting, machining, and the like. For example, stiffening frame 220 may be made from stainless steel sheet metal.

Stiffening frame 220 includes a central opening 226. In certain embodiments, stiffening frame 220 is configured so that opening 226 is generally arranged so as to be substantially concentric with one or more IC chip(s) 202. Stiffening frame 220 includes a base portion 222 and may include sidewalls 224. An underside 199 of the base portion 222 is attached to the carrier 206. Sidewalls 224, if employed, extend upward from a topside 201 of base portion 222 and provide additional stiffening to in-plane bending of the overall assembly. In certain embodiments, stiffening frame 220 includes two sidewalls 224, four sidewalls 224, and the like. Sidewall 224 topside 201 surfaces may be coplanar. In an embodiment, opposing or opposite facing sidewall 224 topside 201 surfaces are coplanar.

IC chip module 200 includes an IC chip 202. IC chip 202 may be an integrated circuit chip, semiconductor die, processor, microchip, and the like. Interconnects electrically connect chip 202 and the topside 201 of carrier 206 and may be a wire bond, solder bond, stud, conductive ball, conductive button, and the like. An underfill may be electrically-insulating, may substantially surround the interconnects, may isolate individual interconnects, and may provide mechanical support between IC chip 202 and carrier 206. Underfill may also prevent damage to individual interconnects due to thermal expansion mismatches between IC chip 202 and carrier 206.

IC chip module 200 includes first directional heat spreader 210. First directional heat spreader 210 generally transfers heat efficiently in a first opposing bivector direction 213 as well as through its thickness. Opposing bivector direction 213 consists of two opposing vectors (i.e. 180 degrees relative to each other). First directional heat spreader 210 is made from a directionally thermally conductive material such as graphite. In a certain embodiment, first directional heat spreader 210 may be fabricated from Pyroid® HT manufactured by Minteq® Pyrogenics Group. First directional heat spreader 210 has a higher coefficient of thermal conductivity as compared to copper in a first opposing bivector direction 213.

First directional heat spreader 210 thermally contacts the one or more IC chip(s) 202. Thermally contacts shall mean efficient heat transfer between elements achieved by the reduction of air gaps there between. A thermal interface material (TIM) may be applied to the top side 201 of IC chip 202 and the first directional heat spreader 210 may be applied to the top side 201 of IC chip 202 contacting the TIM. The TIM may be a thermal grease, gel, and the like, as is known in the art. For example, the underside 199 of the first directional heat spreader 210 thermally contacts the topside 201 of IC chip 202.

When attached to IC chip 202, the first directional heat spreader 210 may contact stiffener base portion 222 and/or opposing sidewalls 224 of stiffener 220. As such, the length of the first directional heat spreader 210 is approximately equal to the distance between the opposing sidewalls 224. The first directional heat spreader 210 may be press fit, interference fit, and the like, to the opposing sidewalls of stiffener 220. The first directional heat spreader 210 may also be attached via adhesive, silicone, and the like, to the base portion 222 and/or opposing sidewalls 224 of stiffener 220. For example, the underside 199 of the first direction heat spreader 210 may thermally contact the topside 201 of the base portion 222.

The first directional heat spreader 210 may be fabricated such that the opposing bivector direction 213 may generally point to the opposing sidewalls 224 of stiffener 220. In an embodiment, when attached to IC chip 202, a topside 201 surface of first directional heat spreader 210 may be coplanar with the topside 201 surface of stiffening frame 220. In another embodiment, when attached to IC chip 202, a topside 201 surface of first directional heat spreader 210 may be raised relative to the topside 201 surface of stiffening frame 220.

First directional heat spreader 210 may include a topside 201 recess 212. Recess 212 may be to a depth approximately equal to half the overall height of the first directional heat spreader 210. A top side 201 of recess 212 is generally below the top side 201 of the first directional heat spreader 210. A dimension "m" of first directional heat spreader 210 may be equal to a dimension "n" of recess 212. Recess 212 may be centered upon a dimension "l" of first directional heat spreader 210.

Contacting the stiffening frame 220 and being in thermal contact with IC chip 202, the first directional heat spreader 210 may transfer heat from the IC chip 202 to the opposing sidewalls 224 of stiffener 220 along bivector direction 213.

IC chip module 200 may include a second directional heat spreader 216. Second directional heat spreader 216 generally transfers heat efficiently in a second opposing bivector direction 215 as well as through its thickness. Opposing bivector direction 215 consists of two opposing vectors (i.e. 180 degrees relative to each other). Opposing bivector direction 215 is orthogonal to the opposing bivector direction 213. Second directional heat spreader 216 is made from a directionally thermally conductive material such as graphite. In a certain embodiment, first directional heat spreader 216 may be fabricated from Pyroid® HT manufactured by Minteq® Pyrogenics Group. Second directional heat spreader 216 has a higher coefficient of thermal conductivity as compared to copper in a second opposing bivector direction 215.

Second directional heat spreader 216 thermally contacts the first directional heat spreader 210. A thermal interface material (TIM) may be applied to the top side 201 of recess 212 and the second directional heat spreader 216 may be applied to the top side 201 of recess 212 contacting the TIM. The TIM may be a thermal grease, gel, and the like, as is known in the art. For example, an underside 199 of the second directional heat spreader 216 thermally contacts the topside 201 of recess 212. More specifically, an underside 199 of recess 218 of the second directional heat spreader 216 may thermally contact the topside 201 of recess 212.

When attached to the first directional heat spreader 210, the second directional heat spreader 216 may contact stiffener base portion 222 and/or opposing sidewalls 224 of stiffener 220. As such, the length of the second directional heat spreader 216 is approximately equal to the distance between the opposing sidewalls 224. The second directional heat spreader 216 may be press fit, interference fit, and the like, to the opposing sidewalls of stiffener 220. The second directional heat spreader 216 may also be attached via adhesive, silicone, and the like, to the base portion 222 and/or opposing sidewalls 224 of stiffener 220. For example, the underside 199 of the second direction heat spreader 216 may thermally contact the topside 201 of the base portion 222.

The second directional heat spreader 216 may be fabricated such that the opposing bivector direction 215 may generally point to the opposing sidewalls 224 of stiffener 220. In an embodiment, when attached to the first directional heat spreader 210, the topside 201 surface of second directional heat spreader 216 may be coplanar with the topside 201 surface of stiffening frame 220 and the topside 201 surface of the first directional heat spreader 210. In another embodiment, when attached to the first directional heat spreader 210, the topside 201 surface of second directional heat spreader 216 may be raised relative to the topside 201 surface of stiffening frame 220 and be coplanar with the topside 201 surface of the first directional heat spreader 210.

Second directional heat spreader 216 may include an underside 199 recess 218. Recess 218 may be to a depth approximately equal to half the overall height of the second directional heat spreader 216. An underside 199 of recess 218 is generally above the underside 199 of the second directional heat spreader 216. A dimension "p" of second directional heat spreader 216 may be equal to a dimension "q" of recess 218. Recess 218 may be centered upon a dimension "o" of second directional heat spreader 216.

Dimension "n" may be approximately equal to dimension "q" and dimension "p" may equal dimension "m" such that the second directional heat spreader 216 may juxtapose fit with first directional heat spreader 212 via the fitting, linking, slotting, dovetailing, and the like, of recess 218 and recess 212, respectively. The second directional heat spreader 216 may be press fit, interference fit, adhered and the like, to the first directional heat spreader 210. The second directional heat spreader 216 may also thermally contact the first directional heat spreader 210. For example, dimensions of recess 212 and/or recess 218 may be adjusted to allow for TIM material to lay between the second directional heat spreader 216 and the first directional heat spreader 210 upon recess 212 and recess 218 surfaces. In this instance, the coplanarity of the topside 201 surface of second directional heat spreader 216 and the topside 201 surface of the first directional heat spreader 210 may be substantially maintained.

Contacting the stiffening frame 220, and being in thermal contact with the first directional heat spreader 210, the second directional heat spreader 216 may transfer heat from the first directional heat spreader 210 to the opposing sidewalls 224 and base 222 of stiffener 220 along bivector direction 215.

The first directional heat spreader 210 and the second directional heat spreader 216 may be packaged together prior to thermally contacting the first directional heat spreader 210 with IC chip 202. For example, the first directional heat spreader 210 and the second directional heat spreader 216 may be packaged together (e.g., via contacting, via thermally contacting, and the like), and a thermally conductive, adhesion-promoting coating, such as Nickel plating, and the like, may be deposited upon the first directional heat spreader 210 and the second directional heat spreader 216 package.

Generally because of the increased directional coefficient of thermal conductivity, the first directional heat spreader 210 and/or the second directional heat spreader 216 may remove heat from IC chip 202 more efficiently as compared to a traditional lid 116 and assist in the efficient heat removal from IC chip module 200 to an external heat sink by spreading heat more evenly over top sides 201 of first directional heat spreader 210 and/or second directional heat spreader 216.

The various TIMs referenced herein, may be similar or dissimilar. The TIMs generally reduces air gaps between elements, thereby increasing heat transfer there between. The TIMs may be a thermal gel, thermal compound, thermal paste, heat paste, and the like. In various embodiments, each IC chip 202 of IC chip module 200 may be thermally joined to an associated cover 204 with the same thickness of thermal interface material 206. In other embodiments, the various thermal interface materials 206 may be of differing thicknesses.

IC chip module 200 may be packaged with higher level electronic device components, such as a motherboard and/or a heat sink, according to various embodiments of the present invention. The electronic device may be for example a computer, server, mobile device, tablet, and the like. IC chip module 200 may be connected to a motherboard via interconnects. Motherboard may be the main printed circuit board of the electronic device and includes electronic components, such as a graphics processing unit, memory, and the like, and provides connectors for other peripherals. The interconnects electrically connect carrier 206 to the motherboard and may be a wire bond, solder bond, stud, conductive ball, conductive button, and the like. The interconnects may be larger and more robust than the interconnects that connect the IC chip 202 with the carrier 206. When IC chip module 200 is seated upon motherboard a second reflow process may be performed to join interconnects to electrical contacts of both carrier 206 and motherboard. Alternately, a mechanical pressurized interconnect may be established.

To assist in the removal of heat from IC chip 202 a heat sink may thermally contact the IC chip module 200 via a TIM. Heat sink may be a passive heat exchanger (e.g. pin heat sink, electronic device chassis, and the like) that cools IC chip 202 by dissipating heat into the surrounding air. The heat sink may also be an active heat exchanger (i.e. forced air, forced liquid cooling system, and the like). More specifically, the heat sink may thermally contact the topside 201 surfaces of the first directional heat spreader 210 and the second direction heat spreader 216. As such, during operation of electronic device, a thermal path exists from IC chip 202 to the first directional heat spreader 210 and the second direction heat spreader 216. The thermal path may continue by transferring heat from the top sides 201 of the first directional heat spreader 210 and the second direction heat spreader 216 to the heat sink.

Figure 8:
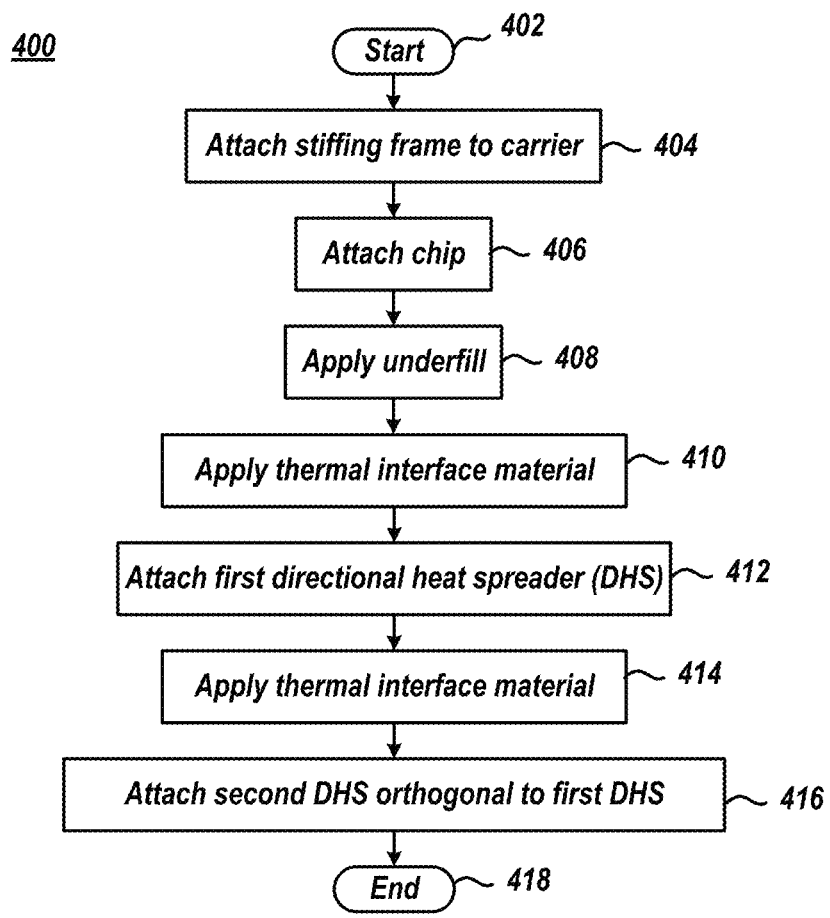
FIG. 8 depicts a method for fabricating an IC chip module, according to one or more embodiments of the present invention.

FIG. 8 depicts a method 400 for manufacturing IC chip module 200 according to various embodiments of the present invention. Method 400 begins at block 402 and continues with attaching stiffening frame 220 to carrier 206 (block 404). When being attached, stiffening frame 220 may be aligned with carrier 206 such that opening 226 is substantially concentric with IC chip 202 or, if IC chip 202 is not yet installed, with locations to which IC chip 202 will be attached to carrier 206. An adhesive may be applied to the underside 199 of stiffening frame 220 or to topside 201 of carrier 206. Depending upon the type of adhesive, a curing process may be needed to cure the adhesive.

In certain embodiments, the IC chip 202 is attached to carrier 206 (block 406) by way of interconnects and underfill is applied (block 408). In certain embodiments IC chip 202 is attached using a solder bump processes including a solder reflow. Underfill may be applied around a portion of the perimeter of IC chip 202 and drawn thereunder by capillary action. In some embodiments, underfill may be subject to a curing process. The curing of underfill may or may not coincide with the curing of the adhesive connecting the stiffening frame 220 and the carrier 206. In some embodiments, block 406 and block 408 may be performed prior to block 202. That is, stiffening frame 220 may be attached to carrier 206 before, during, or after IC chip 202 is attached and/or underfill is deposited.

An adhesive may be applied to stiffening frame 220. For example, adhesive may be applied to base portion 222 of stiffening frame 220 and/or inner surfaces of sidewalls 224. If polymeric, adhesive 308 may be applied by brush, dispenser, and the like. Adhesive 308 may also consist of a b-staged epoxy or adhesive preform and may be pre-attached to stiffener 220.

In various embodiments, thermal interface material may be applied to IC chip 202 and/or the underside of the first directional heat spreader 210 (block 410). The first directional heat spreader 210 is attached to stiffening frame 202 and thermally contacts IC chip 202 (block 412). In various embodiments, another thermal interface material may be applied to the topside 201 of first directional heat spreader recess 212 or the underside 199 second directional heat spreader recess 218 (block 414). The second directional heat spreader 216 is attached the first heat spreader 210 (block 416). Method 400 ends at block 418.

Figure 9:
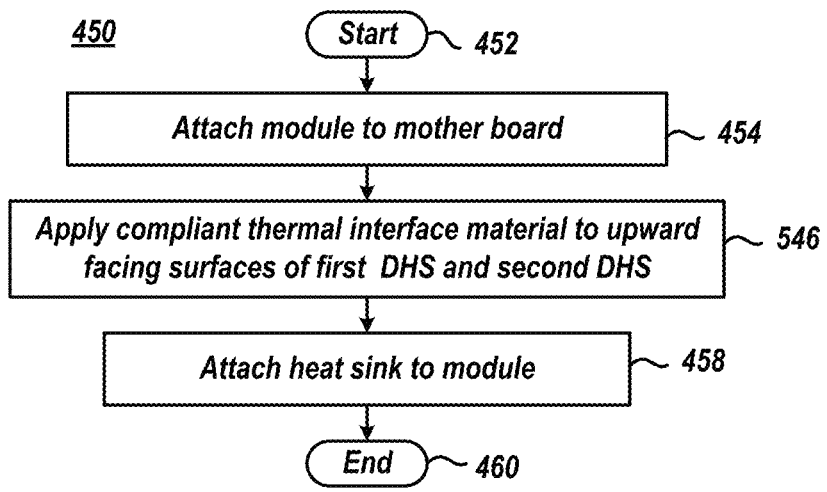
FIG. 9 depicts a method for installing an IC chip module into an electronic device, according to one or more embodiments of the present invention.

FIG. 9 depicts a method 450 for installing a IC chip module 200 into an electronic device according to various embodiments of the present invention. Method 450 begins at block 452. In certain embodiments, IC chip module 200 is attached to a motherboard via interconnects (block 454). As addressed above, IC chip module 200 may be attached using a solder bump processes including a solder reflow; and in other embodiments, IC chip module 200 may be attached to motherboard via a land grid array or ball grid array socket, or other interconnection scheme.

A thermal interface material is applied to IC chip module 200 (block 546). For example, thermal interface material may be injected, painted, spread, placed on or otherwise applied to the topside 201 surfaces of the first directional heat spreader 210 and the second directional heat spreader.

A heat sink may be attached to IC chip module 200 (block 458). For example, heat sink may be attached utilizing thermal interface material, thermal tape, epoxy, preform, and the like. Generally, a force may be applied to secure heat sink to IC chip module 200. Method 450 ends at block 460. A heat transfer path exists generally between the IC chip 202 and the heat sink via the first directional heat spreader 210 and the second directional heat spreader 216.

Figure 10:
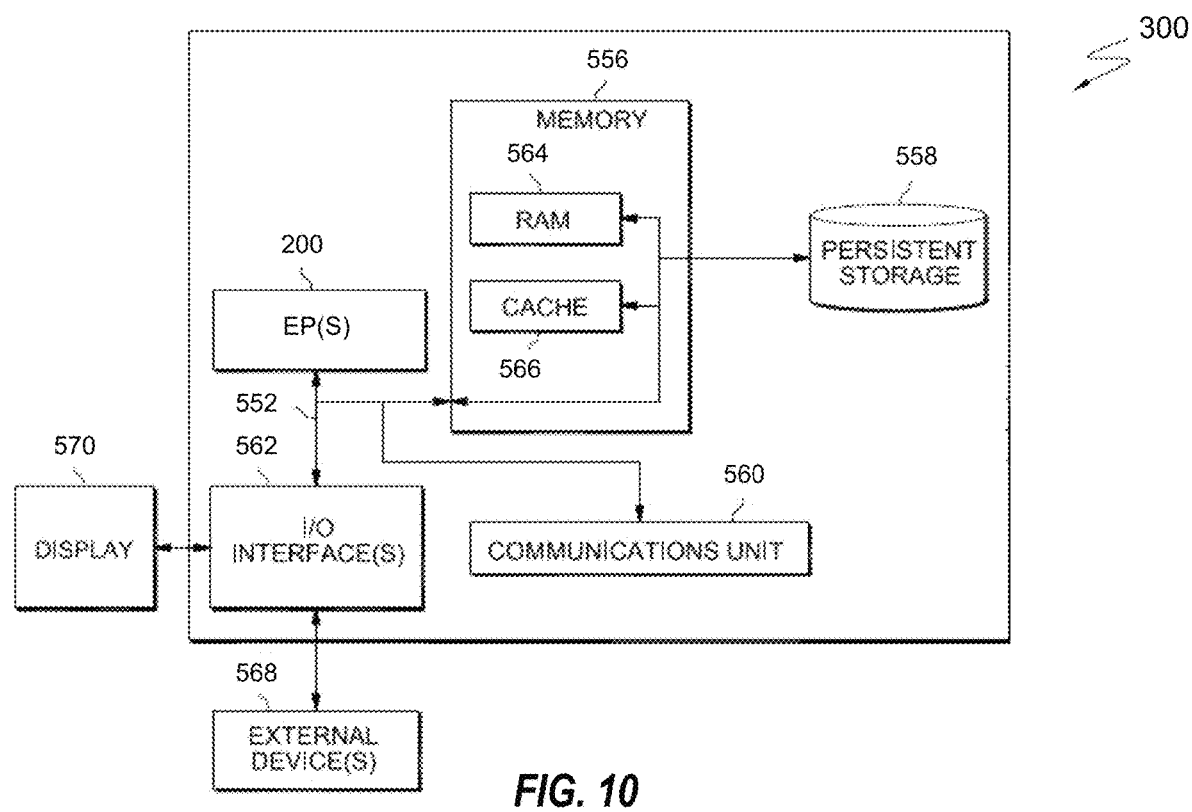
FIG. 10 depicts a block diagram of an exemplary electronic device that utilizes a IC chip module, according to one or more embodiments of the present invention.

FIG. 10 depicts a block diagram of an exemplary electronic device 300 that may utilize an IC chip module 200 according to an embodiment of the present invention. It should be appreciated that FIG. 10 provides only an illustration of one implementation of an embodiment of the present invention and does not imply any limitations with regard to the environment in which different embodiments may be implemented.

Electronic device 300 includes communications bus 552, which provides communications between IC chip module (s) 200, memory 556, persistent storage 558, communications unit 560, and input/output (I/O) interface(s) 562. Memory 556 may be, for example, one or more random access memories (RAM) 564, cache memory 566, or any other suitable non-volatile or volatile storage device. Persistent storage 558 can include one or more of flash memory, magnetic disk storage device of an internal hard drive, a solid state drive, a semiconductor storage device, read-only memory (ROM), EPROM, or any other computer-readable tangible storage device that is capable of storing program instructions or digital information.

The media used by persistent storage 558 may also be removable. For example, a removable hard drive may be used for persistent storage 558. Other examples include an optical or magnetic disk that is inserted into a drive for transfer onto another storage device that is also a part of persistent storage 558, or other removable storage devices such as a thumb drive or smart card.

Communications unit 560 provides for communications with other electronic devices. Communications unit 560 includes one or more network interfaces. Communications unit 560 may provide communications through the use of either or both physical, optical and wireless communications links. In other embodiments, electronic device 200 may be devoid of communications unit 560. Software may be downloaded to persistent storage 558 through communications unit 560.

I/O interface(s) 562 allows for input and output of data with other devices that may be connected to electronic device 200. For example, I/O interface 562 may provide a connection to external devices 568 such as a camera, mouse, keyboard, keypad, touch screen, and/or some other suitable input device. I/O interface(s) 562 also connects to display 570.

Display 570 provides a mechanism to display data to a user and may be, for example, a computer monitor. Alternatively, display 570 may be integral to electronic device 200 and may also function as a touch screen.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 206, regardless of the actual spatial orientation of the carrier 206. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. A method comprising:
    attaching a stiffening frame to a carrier, the stiffening frame comprising a central opening to accept a semiconductor chip, a base portion, a first pair of opposing sidewalls, and a second pair of opposing sidewalls;
    electronically coupling the semiconductor chip to the carrier concentrically arranged within the central opening;
    thermally contacting a first directional heat spreader to the semiconductor chip, the first directional heat spreader arranged to transfer heat from the semiconductor chip in a first opposing bivector direction towards the first pair of opposing sidewalls; and
    thermally contacting a second directional heat spreader to the first directional heat spreader, the second directional heat spreader arranged to transfer heat from the first directional heat spreader in a second opposing bivector direction towards the second pair of opposing sidewalls.

2. The method of claim 1, wherein the first directional heat spreader contacts the first pair of opposing sidewalls.

3. The method of claim 1, wherein the first directional heat spreader contacts a topside of the base portion.

4. The method of claim 1, wherein a topside of the first directional heat spreader is coplanar with a topside of the second directional heat spreader.

5. The method of claim 1, wherein the first opposing bivector direction and the second opposing bivector direction are orthogonal.

6. The method of claim 1, wherein the second directional heat spreader contacts the second pair of opposing sidewalls.

7. The method of claim 1, wherein the first directional heat spreader comprises a higher coefficient of thermal conductivity relative to copper.

8. The method of claim 1, wherein the second directional heat spreader comprises a higher coefficient of thermal conductivity relative to copper.

9. The method of claim 1, wherein the first directional heat spreader is comprised of graphite.

10. The method of claim 9, wherein each basal plane of the graphite first directional heat spreader is parallel to a topside of the graphite first directional heat spreader and wherein each said basal plane of the graphite first directional heat spreader transfers heat in the first opposing bivector direction towards the first pair of opposing sidewalls.

11. The method of claim 1, wherein the second directional heat spreader is comprised of graphite.

12. The method of claim 11, wherein each basal plane of the graphite second directional heat spreader is parallel to a topside of the graphite second directional heat spreader and wherein each said basal plane of the graphite second directional heat spreader transfers heat in the first opposing bivector direction towards the second pair of opposing sidewalls.

* * * * *